(12) United States Patent
Qin et al.

(10) Patent No.: US 12,219,807 B2
(45) Date of Patent: Feb. 4, 2025

(54) DISPLAY PANEL INCLUDING TRANSPARENT REGION HAVING TRANSPARENT PORTIONS AND TERMINAL DEVICE

(71) Applicant: BOE TECHNOLOGY GROUP CO., LTD., Beijing (CN)

(72) Inventors: Wei Qin, Beijing (CN); Zhiqiang Xu, Beijing (CN); Weixing Liu, Beijing (CN); Wanpeng Teng, Beijing (CN); Chunfang Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 706 days.

(21) Appl. No.: 17/330,704

(22) Filed: May 26, 2021

(65) Prior Publication Data

US 2022/0115455 A1    Apr. 14, 2022

(30) Foreign Application Priority Data

Oct. 13, 2020    (CN) .......................... 202011091272.9

(51) Int. Cl.
*H10K 59/121*    (2023.01)
*H10K 59/65*    (2023.01)

(52) U.S. Cl.
CPC ........... *H10K 59/121* (2023.02); *H10K 59/65* (2023.02)

(58) Field of Classification Search
CPC ..................................................... H10K 59/65
See application file for complete search history.

(56) References Cited

U.S. PATENT DOCUMENTS

| 2018/0012942 | A1  | 1/2018  | Adachi |
| 2020/0133040 | A1* | 4/2020  | Bang ................... G02F 1/1368 |
| 2020/0411607 | A1* | 12/2020 | Jian .................... H10K 59/60 |
| 2022/0115365 | A1* | 4/2022  | Zhan ................. H01L 27/14618 |
| 2023/0343812 | A1* | 10/2023 | Zhang ................... H01L 27/156 |

FOREIGN PATENT DOCUMENTS

| CN | 110867480 A | 3/2020 |
| CN | 111477113 A | 7/2020 |
| TW | 201624087 A | 7/2016 |

OTHER PUBLICATIONS

Office Action issued on Nov. 12, 2023, in corresponding Chinese patent Application No. 202011091272.9, 12 pages.

* cited by examiner

*Primary Examiner* — Suberr L Chi
(74) *Attorney, Agent, or Firm* — XSENSUS LLP

(57) ABSTRACT

The present disclosure relates to a display panel and a terminal device. The display panel includes a display region. At least a part of the display region is a transparent region. The transparent region has a plurality of pixel rows distributed along a column direction, and each of the plurality of pixel rows includes pixels and transparent portions arranged in a row direction. The pixel rows include first pixel rows and second pixel rows, transparent portions each arranged between two adjacent pixels in each of the first pixel rows are first transparent portions, and transparent portions each arranged between two adjacent pixels in each of the second pixel rows are second transparent portions. A width of each of the first transparent portions in the row direction is greater than a width of each of the second transparent portions in the row direction.

20 Claims, 10 Drawing Sheets

DISPLAY PANEL INCLUDING TRANSPARENT REGION HAVING TRANSPARENT PORTIONS AND TERMINAL DEVICE

CROSS-REFERENCE TO RELATED APPLICATION

This application is based upon, and claims the benefit of and priority to, Chinese Patent Application No. 202011091272.9, filed Oct. 13, 2020, the entire contents of which are incorporated herein by reference.

TECHNICAL FIELD

The present disclosure relates to display technologies and, in particular, to a display panel and a terminal device.

BACKGROUND

With the increasing screen-to-body ratio of terminal devices, such as mobile phones, solutions of setting a camera below a screen to capture images have gained widespread attentions. In related arts, a region of the screen corresponding to the camera can not only display images, but also has light transmission characteristics, so that the camera can capture images in front of the screen. However, in the current under-screen camera schemes, the images taken by the camera are relatively blurry, and the image quality needs to be improved.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provide a display panel and a terminal device.

According to an aspect of the present disclosure, there is provided a display panel. The display panel includes a display region. At least a part of the display region is a transparent region. The transparent region has a plurality of pixel rows distributed along a column direction, and each of the plurality of pixel rows includes a plurality of pixels and a plurality of transparent portions arranged in a row direction.

The plurality of pixel rows include a plurality of first pixel rows and a plurality of second pixel rows, wherein transparent portions each arranged between two adjacent pixels in each of the first pixel rows are first transparent portions, and transparent portions each arranged between two adjacent pixels in each of the second pixel rows are second transparent portions.

A width of each of the first transparent portions in the row direction is greater than a width of each of the second transparent portions in the row direction.

According to an exemplary embodiment of the present disclosure, the first pixel rows are divided into a plurality of first row units, the second pixel rows are divided into a plurality of second row units, and the first row units and the second row units are alternately distributed along the column direction;

in the column direction, first transparent portions in an n-th first pixel row and corresponding first transparent portions in a (n+i)-th first pixel row are arranged in same columns in a one-to-one correspondence;

where n+i≤N, N is a number of the first pixel rows, and n and i are both positive integers; and first transparent portions in any one of the first pixel rows and at least a part of corresponding second transparent portions in at least one of the second pixel rows are arranged in same columns in a one-to-one correspondence.

According to an exemplary embodiment of the present disclosure, there is one first pixel row in each of the first row units, and there is one second pixel row in each of the second row units;

a value of i is 1; and second transparent portions in one of any two of the second pixel rows and corresponding second transparent portions in another one of the any two of the second pixel rows are arranged in same columns in a one-to-one correspondence.

According to an exemplary embodiment of the present disclosure, there is one first pixel row in each of the first row units, and there is one second pixel row in each of the second row units;

a value of i is 2, and any one of the first transparent portions in the n-th first pixel row and any one of the first transparent portions in the (n+1)-th first pixel row are arranged in different columns; and second transparent portions in any two of the second pixel rows are arranged in same columns in a one-to-one correspondence.

According to an exemplary embodiment of the present disclosure, there is one first pixel row in each of the first row units, and there are a plurality of second pixel rows in each of the second row units;

in a same second row unit, any two second transparent portions in two adjacent ones of the second pixel rows are arranged in different columns; and a value of i is greater than or equal to 2, and any one of the first transparent portions in the n-th first pixel row and any one of the first transparent portions in the (n+1)-th first pixel row are arranged in different columns.

According to an exemplary embodiment of the present disclosure, there are two second pixel rows in each of the second row units, and the value of i is 2 or 4.

According to an exemplary embodiment of the present disclosure, there is one first pixel row in each of the first row units, and there are three second pixel rows in each of the second row units;

a value of i is 1; and in a same second row unit, any two second transparent portions in two adjacent ones of the second pixel rows are arranged in different columns;

and two second row units which are arranged at both sides of any one of the first row units and are adjacent to the any one of the first row units are arranged symmetrically with respect to the any one of the first row units.

According to an exemplary embodiment of the present disclosure, there are a plurality of first pixel rows in each of the first row units, and there are a plurality of second pixel rows in each of the second row units;

in a same first row unit, any two first transparent portions in two adjacent ones of the first pixel rows are arranged in different columns;

in a same second row unit, any two second transparent portions in two adjacent one of the second pixel rows are arranged in different columns; and first transparent portions in one of the first pixel rows of any one first row unit and corresponding first transparent portions in one of the first pixel rows of another first row unit are arranged in same columns in a one-to-one correspondence.

According to an exemplary embodiment of the present disclosure, there are two first pixel rows in each of the first row units, and there are two second pixel rows in each of the second row units; and a value of i is 2.

According to an exemplary embodiment of the present disclosure, the first pixel rows are divided into a plurality of first row units, the second pixel rows are divided into a plurality of second row units, and the first row units and the second row units are alternately distributed along the column direction;

there are a plurality of first pixel rows in each of the first row units, and there is one second pixel row in each of the second row units;

in a same first row unit, any two first transparent portions in two adjacent ones of the first pixel rows are arranged in different columns;

two first row units which are arranged at both sides of any one of the second row units and adjacent to the any one of the second row units are arranged symmetrically with respect to the any one of the second row units; and any two second transparent portions in two second row units which are arranged at both sides of any one of the first row units and adjacent to the any one of the first row units are arranged in different columns.

According to an exemplary embodiment of the present disclosure, in the row direction, a sum of a width of one of the pixels and widths of two of the second transparent portions is equal to a width of one of the first transparent portions.

According to an exemplary embodiment of the present disclosure, there are three sub-pixels in each of the pixels, and colors of the three sub-pixels are different from each other;

wherein in the row direction, a width of any one of the first transparent portions is five times a width of one of the sub-pixels, and a width of any one of the second transparent portions is the same as a width of one of the sub-pixels.

According to an exemplary embodiment of the present disclosure, in the transparent region, a ratio of a total area of all the transparent portions to a total area of the transparent region is 11/32 to 16/32.

According to another aspect of the present disclosure, there is provided a terminal device. The terminal device includes:

the display panel as described above; and a camera device arranged on a backlight side of the display panel and opposite to the transparent region, the camera device being configured to take images through the transparent region.

It should be understood that the above general description and the following detailed description are only exemplary and explanatory, and should not be considered as constituting any limitations on the present disclosure.

BRIEF DESCRIPTION OF THE DRAWINGS

The drawings, which are incorporated into the specification and constitute a part of the specification, show embodiments in accordance with the disclosure, and are used to explain the principles of the disclosure together with the specification.

LISTING OF MAIN REFERENCE SIGNS

Detailed Description

Figure 1:
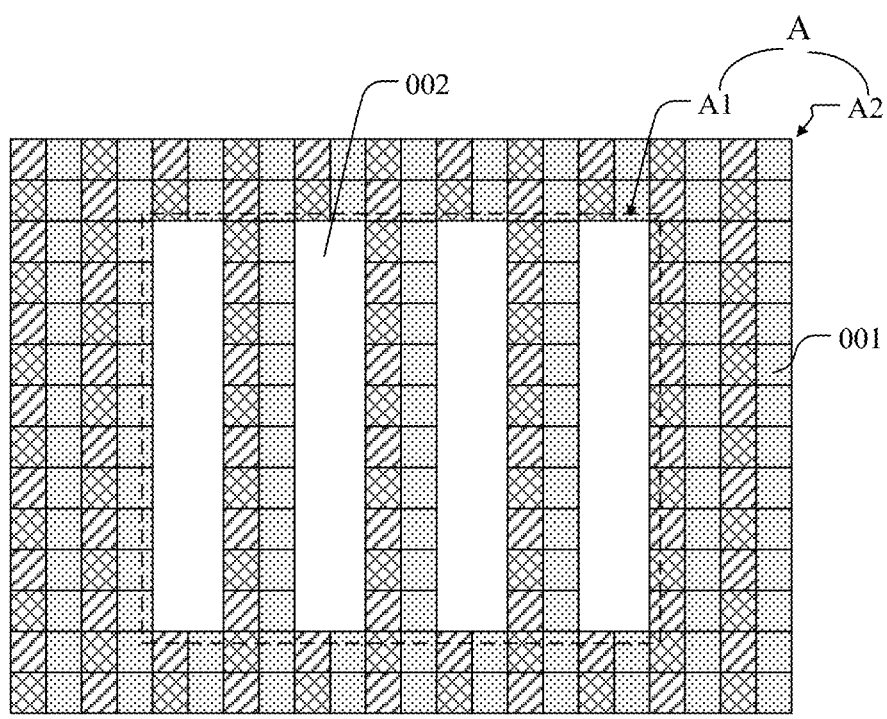
FIG. 1 is a schematic diagram showing an arrangement of transparent portions of a display panel in a related art.

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

The terms "a", "an", "the", "said", and "at least one" are used to indicate the presence of one or more elements/components, and so on; the terms "include" and "have" are open terms and means inclusive, and refers to that in addition to the listed elements/components and so on, there may be other elements/components and so on. The terms "first", "second", and so on are only used as marks, and should not be considered as constituting any limitations on the number of objects.

The row direction and the column direction in embodiments of the present disclosure are two directions perpendicular to each other. For example, the row direction in the drawings is the horizontal direction, and the column direction is the vertical direction. However, the row direction and the column direction are not limited to the horizontal direction and the vertical direction in the drawings. Those skilled in the art can understand that as the display panel rotates, the actual orientation of the row direction and the column direction will change accordingly.

Figure 2:
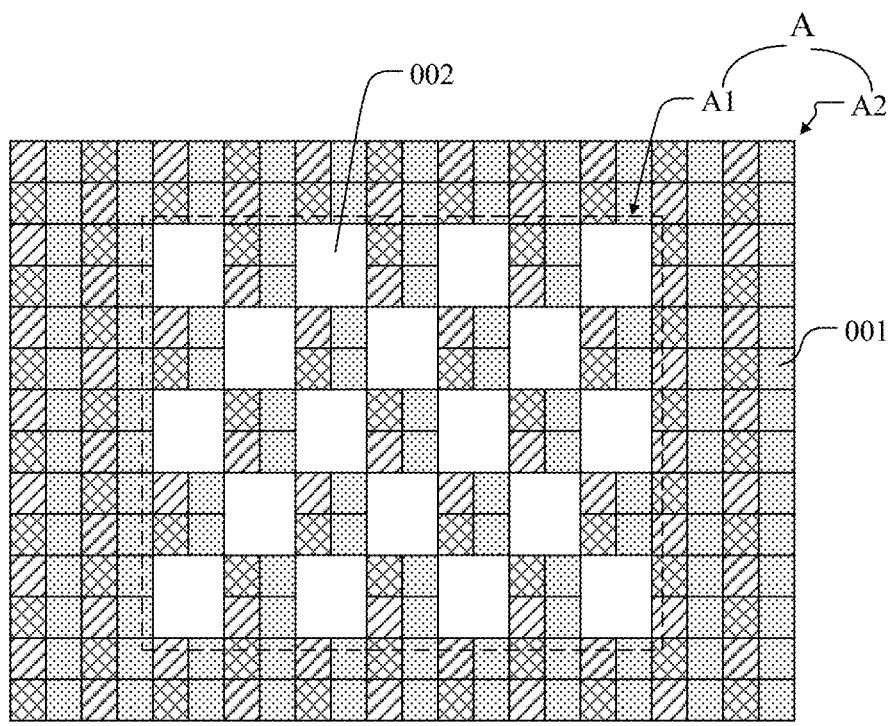
FIG. 2 is a schematic diagram showing another arrangement of transparent portions of a display panel in a related art.

The reference numerals in FIG. 1 and FIG. 2 include: A: display region; A1: transparent display region; A2: peripheral display region; 001: sub-pixel; and 002, transparent portion. The reference numerals in FIGS. 3-14 include: 100: display panel; 1: pixel; 11: sub-pixel; 11R: red sub-pixel; 11G: green sub-pixel; 11B: blue sub-pixel; 10: pixel row; 101: first pixel row; 102: second pixel row; 2: transparent portion; 21: first transparent portion; 22: second transparent portion; S1: first row unit; and S2: second row unit.

As shown in FIGS. 1 and 2, in the related art, an organic light-emitting diode (OLED) display panel has a display region A, and the display region A includes a plurality of sub-pixels 001 arranged in an array. The display region A can be divided into a transparent display region A1 and a peripheral display region A2 surrounding the transparent display region A1. In addition to the sub-pixels 001, the transparent display region A1 is also provided with a plurality of transparent portions 002 arranged in an array. The distribution modes of the transparent portions 002 in FIG. 1 and FIG. 2 are different. The sizes of the transparent portions 002 in FIG. 1 are the same, and the sizes of the transparent portions 002 in FIG. 2 are the same.

When an image is displayed, the sub-pixels 001 in the transparent display region A1 and the peripheral display region A2 can all emit light. When capturing an image, a camera located on the backlight side of the transparent display region A1 can receive the light passing through the transparent portions 002, thereby achieving image capturing. In the procedure in which the light passes through the transparent portions 002, diffraction occurs in the transparent portions 002, forming diffraction fringes, which blurs the image captured by the camera. Further, since the sizes of the transparent portions 002 are the same, the diffraction fringes are distributed in the same manner, which causes the diffraction fringes generated by different transparent portions 002 to easily superpose, which increases the adverse effects caused by diffraction and makes the image more blurred.

Embodiments of the present disclosure provide a display panel, which may be an OLED display panel, as shown in FIGS. 3 to 13. The display panel may include a display region A, and at least a part of the display region A is a transparent region B. The transparent region B has a plurality of pixel rows 10 distributed along the column direction. Each pixel row 10 includes a plurality of pixels 1 and a plurality of transparent portions 2 arranged alternately in the row direction. Each pixel 1 includes multiple sub-pixels 11 arranged adjacently along the row direction.

The pixel rows 10 include a plurality of first pixel rows 101 and a plurality of second pixel rows 102. Transparent portions 2 each arranged between two adjacent pixels 1 in each first pixel row 101 are first transparent portions 21, and transparent portions 2 each arranged between two adjacent pixels 1 in each second pixel row 102 are second transparent portions 21.

A width of each of the first transparent portions 21 in the row direction is greater than a width of each of the second transparent portions 22 in the row direction.

FIGS. 3 to 13 exemplarily show the row direction and the column direction. The row direction is the X direction, and the column direction is the Y direction.

In the display panel according to embodiments of the present disclosure, transparent portions 2 are arranged between pixels in the transparent region B, so that the transparent portions 2 can transmit light, which is convenient for the camera device to take images from the backlight side of the display panel through the transparent region B to realize under-screen photography. When light passes through the transparent portions 2, the diffraction occurs and the images may become blurry. However, the display panel according to embodiments of the present disclosure uses at least two kinds of transparent portions (i.e., the first transparent portions 21 and the second transparent portions 22) which have different widths along the row direction, because the distributions of diffraction fringes are different when the light passes through transparent portions of different widths, the diffraction fringes are not easy to superpose at least in the column direction, and thus the degree of superposition of diffraction fringes between the transparent portions in different pixel rows 10 is weakened, thereby reducing the diffraction effect on the image quality and making the images clearer.

The display panel according to embodiments of the present disclosure will be described in detail below.

Figure 3:
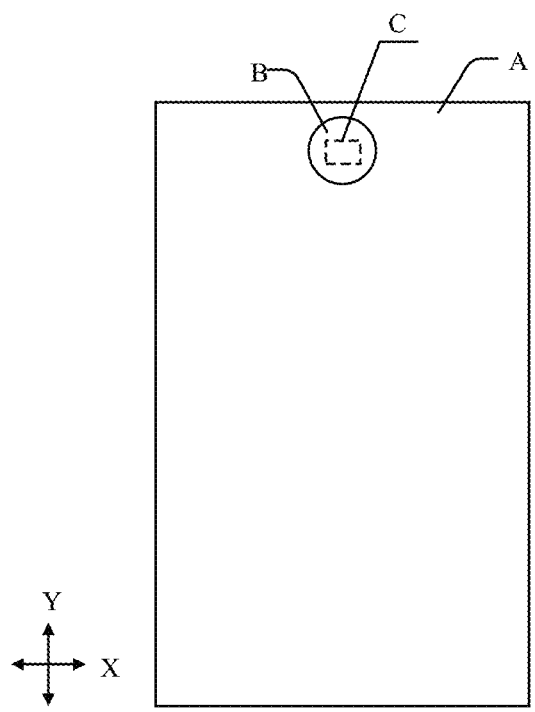
FIG. 3 is a top view of a display panel according to an embodiment the present disclosure.

As shown in FIG. 3, the display panel is an OLED display panel. The display panel includes at least a driving backplane and a light-emitting function layer. The driving backplane may include a pixel circuit region and a peripheral circuit region surrounding the pixel circuit region. The pixel circuit region is located in the display region A, and is provided with a pixel circuit. Of course, at least a part of the pixel circuit region is located in the transparent region B. The peripheral circuit region is located outside the display region A, and is provided with peripheral circuits. The peripheral circuits include at least a light-emitting control circuit and a gate drive circuit. The specific structures of the pixel circuit and the peripheral circuit are not specifically limited here.

The light-emitting function layer is arranged on a side of the driving backplane and is located in the display region A. Of course, at least a part of the light-emitting function layer is located in the transparent region B. In a direction parallel to the driving backplane, the light-emitting function layer may include a plurality of sub-pixels distributed in an array, and each sub-pixel may emit light to a side away from or close to the driving backplane, so as to display images.

As shown in FIGS. 4 to 13, each sub-pixel 11 is an OLED light-emitting unit, and each pixel 1 includes at least three sub-pixels 11 of different colors, for example, a red sub-pixel 11R, a green sub-pixel 11G, and a blue sub-pixel 11B. Each OLED light-emitting unit may include an anode, a cathode, and a light-emitting material layer between the anode and the cathode. By applying electrical signals to the anode and the cathode, the light-emitting material layer can be driven to emit light. According to some embodiments, in the direction perpendicular to the driving backplane, the light-emitting function layer may include a first electrode layer, a pixel definition layer, a light-emitting material layer, and a second electrode layer.

The first electrode layer is arranged on a side surface of the driving backplane, and includes a plurality of first electrodes arranged in an array. Any one of the first electrodes can be used as an anode of an OLED light-emitting unit. The first electrodes may be connected to the pixel circuit in the driving backplane so as to receive an electrical signal to be applied to the first electrodes.

The pixel definition layer and the first electrode layer are arranged on the same surface of the driving backplane, and have a plurality of openings exposing each first electrode in a one-to-one correspondence. Each of the openings is used to define the range of each OLED light-emitting unit, which is the light-emitting range.

The light-emitting material layer covers at least the first electrodes and serves as the light-emitting material layer of the OLED light-emitting units. Of course, the light-emitting material layer can also cover the pixel definition layer, but the region where the light-emitting material layer covers the pixel definition layer cannot emit light, so it does not belong to the OLED light-emitting unit, and only the light-emitting material layer in the opening belongs to the OLED light-emitting unit. The light-emitting material layer may include a hole injection layer, a hole transport layer, an organic light emitting layer, an electron transport layer, and an electron injection layer that are sequentially stacked in a direction away from the driving backplane. At least one of the hole injection layer, the hole transport layer, the organic light emitting layer, the electron transport layer, and the electron injection layer covers the pixel definition layer, which means that the light emitting material layer covers the pixel definition layer.

The second electrode layer covers the light-emitting material layer and serves as the cathode of the OLED light-emitting unit, and multiple OLED light-emitting units can share the same second electrode layer. The second electrode layer may be connected to the peripheral circuit in the driving backplane so as to receive electrical signals to be applied to the second electrode layer. The peripheral circuit is located in a region outside the orthographic projection of the light-emitting function layer on the driving backplane, and its structure is not specifically limited here.

Of course, the display panel according to embodiments of the present disclosure may also include other film layers such as an encapsulation layer, which will not be listed here.

The distribution of the transparent portions 2 in the display region A of the display panel according to embodiments of the present disclosure will be described below.

As shown in FIG. 3, the transparent region B can be a partial area of the display region A, and the camera device can be arranged on a side of the display panel, and the orthographic projection of the camera device on the display panel overlaps with at least part of the transparent region B so as to capture images through the transparent region B and thereby realize the under-screen photography. According to some embodiments, the transparent region B can be overlapped with the display region A, that is, the entire display region A can achieve under-screen photography. The following takes the transparent region B being a partial area of the display region A as an example for description.

As shown in FIGS. 4 to 13, the display region A has pixels 1 arranged in an array. The transparent region B has a plurality of pixel rows 10 distributed along the column direction. The pixel rows 10 extend along the row direction and are arranged along the column direction. Each pixel row 10 includes a plurality of pixels 1 and a plurality of transparent portions 2 alternately arranged in the row direction, and each pixel 1 includes a plurality of sub-pixels 11 arranged adjacently in the row direction, that is, two adjacent pixels 1 are separated by a transparent portion 2.

The transparent region B does not mean that the region is completely transparent; the transparent region B means that in the transparent region B, in addition to the sub-pixels 11, a plurality of transparent portions 2 are also provided, so that the transparent region B can display images and transmit light. Exemplarily, in order to realize the light transmission of the transparent portions 2, through holes may be formed on the pixel definition layer, and the light-emitting material layer and the first electrodes are not provided at the position corresponding to the through holes. If the second electrode layer has a transparent structure, the second electrode layer may cover the through holes, or may expose the through holes. The transparent portions 2 are located at the through holes, and light can be transmitted through the transparent portions 2.

As shown in FIGS. 4 to 13, each pixel 1 includes a plurality of sub-pixels 11 arranged adjacently in the row direction. For example, each pixel 1 includes three sub-pixels 11 with different colors, such as a red sub-pixel 11R, a green sub-pixel 11G and a blue sub-pixel 11B. The color sequences of the sub-pixels 11 of pixels 1 in the row direction in the transparent region B are the same, so that pixel sharing is not needed between any two pixels 1.

Figure 4:
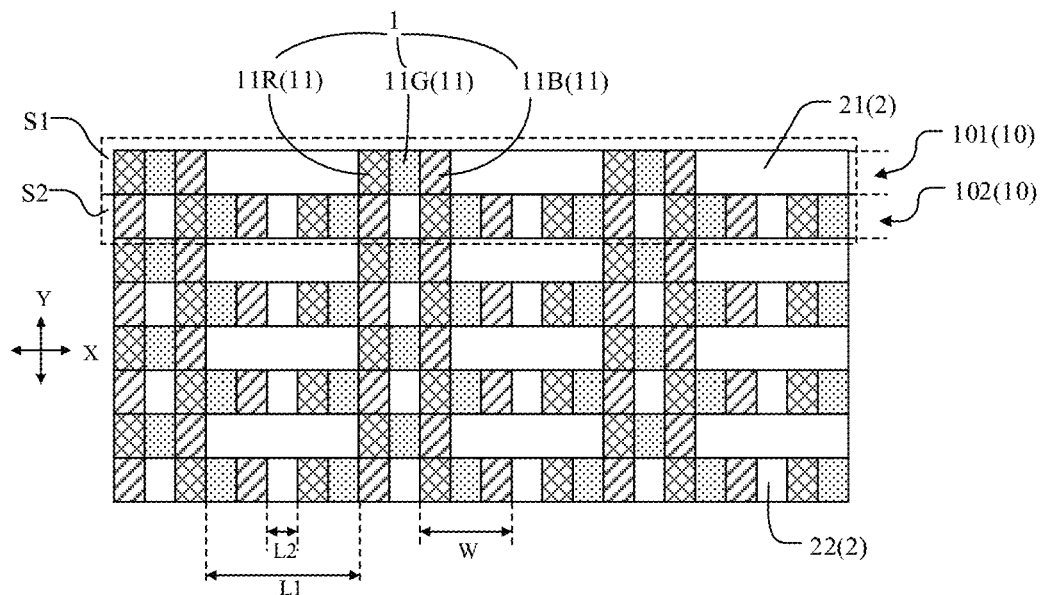
FIG. 4 is an enlarged view of the part C of the display panel as shown in FIG. 3 according to a first implementation.

As shown in FIG. 4, in the transparent region B, the heights of the transparent portions 2 are the same in the column direction. In order to reduce the superimposition of the diffraction fringes of the transparent portions 2, the widths of the transparent portions 2 in the row direction can be of at least two kinds, that is, at least two kinds of transparent portions 2 of different sizes are provided. The transparent portions 2 can be divided into at least first transparent portions 21 and second transparent portions 22 depending on the widths of the transparent portions 2 in the row direction. The width L1 of each first transparent portion 21 in the row direction is greater than the width L2 of each second transparent portion 22 in the row direction.

For example, in the row direction, the sum of the width W of a pixel 1 and the widths L2 of two second transparent portions 22 is equal to the width L1 of a first transparent portion 21, that is, W+2L2=L1. That is, the total width of one pixel 1 and its adjacent two second transparent portions 22 in the row direction is equal to the width of one first transparent portion 21 in the row direction.

Further, as shown in FIG. 4, in the row direction, the width L1 of any first transparent portion 21 is five times the width of a sub-pixel 11, and the width L2 of any second transparent portion 22 is equal to the width of a sub-pixel 11. That is, the width in the row direction of the through hole in the pixel definition layer corresponding to a first transparent portion 21 is equal to the widths of 5 openings corresponding to the sub-pixels 11, and the width of the through hole corresponding to a second transparent portion 22 in the pixel definition layer is equal to the width of the opening corresponding to one sub-pixel 11.

As shown in FIGS. 4 to 13, in the transparent region B, the widths of the transparent portions 2 in the same pixel row 10 are the same, so that the pixel rows 10 can be divided into at least two types, namely first pixel rows 101 and second pixel rows 102. The transparent portions 2 in the first pixel rows 101 are the first transparent portions 21, and the transparent portions 2 in the second pixel rows 102 are the second transparent portion 22.

Sub-pixels are also distributed in the area outside the transparent region B in the display region A, and such sub-pixels can be arranged in a BGRG arrangement or a GGRB arrangement, that is, four sub-pixels 11 including a blue sub-pixel, a green sub-pixel, a red sub-pixel, and a green sub-pixel (BGRG) are taken as one repetition unit, four sub-pixels 11 including a green sub-pixel, a green sub-pixel, a red sub-pixel, and a blue sub-pixel (GGRB) are taken as a repetition unit. The pixels are driven by sub pixel rendering (SPR). The resolution of the images can be improved by sharing sub pixels without increasing the number of sub pixels. The specific arrangements and driving principles are not detailed here. Of course, there can be other arrangements. Embodiments of the present disclosure do not impose specific limitations on the arrangements or distributions of the sub-pixels 11 in other area of the display region A than the transparent region B.

In order to facilitate manufacturing and driving, any pixel row 10 in the transparent region B is located in the same rows as a row of sub-pixels 11 in other area of the display region A than the transparent region B, and any column of sub-pixels 11 in the transparent region B are located in the same columns as a column of sub-pixels 11 in other area of the display region A than the transparent region B.

The distributions of the transparent portions 2 in the transparent region B will be described in detail below.

As shown in FIGS. 4 to 13, for ease of explanation, all the first pixel rows 101 can be divided into a plurality of first row units S1, and all the second pixel rows 102 can be divided into a plurality of second row units S2. The first row units S1 and the second row units S2 are alternately distributed along the column direction.

When it is mentioned that a first transparent portion 21 and a second transparent portion 22 are arranged in the same column, such arrangement is based on the central axes of the first transparent portion 21 and the second transparent portion 22 along the column direction, that is, the central axes of the first transparent portion 21 and the second transparent portion 22 are collinear. If the first transparent portion 21 and the second transparent portion 22 are arranged in different columns, it means that the he central axes of the first transparent portion 21 and the second transparent portion 22 are parallel.

Further, the distributions of the pixels 1 and the transparent portions 2 in the transparent region B may comply with one of the following rules, such as the first rule and the second rule.

First Rule in the column direction, first transparent portions 21 in an n-th first pixel row 101 and corresponding first transparent portions 21 in a (n+i)-th first pixel row 101 are arranged in same columns in a one-to-one correspondence;
  where N+i≤N, N is the number of the first pixel rows 101, and n and i are both positive integers, such as, 1, 2, 3 or 4; and
  first transparent portions 21 in any one of the first pixel rows 101 and at least a part of corresponding second transparent portions 22 in at least one of the second pixel rows 102 are arranged in same columns in a one-to-one correspondence.

Under the first rule, at least the following implementations are included:

First Implementation

For example, as shown in FIG. 4, the number of the first pixel rows 101 in a first row unit S1 is one, and the number of the second pixel rows 102 in a second row unit S2 is one. That is, in this implementation, the first pixel rows 101 and the second pixel rows 102 are alternately distributed along the column direction. One pixel 1 includes three sub-pixels 11.

The value of i is 1, so that the first transparent portions 21 of any two first pixel rows 101 are arranged in same columns in a one-to-one correspondence. That is, in the transparent region B, the first transparent portions 21 is arranged in multiple columns, and the number of columns is the same as the number of the first transparent portions 21 in any first pixel row 101.

The second transparent portions 22 of any two second pixel rows 102 are arranged in same columns in a one-to-one correspondence. That is, in the transparent region B, the second transparent portions 22 are arranged in multiple columns, and the number of columns is the same as the number of the second transparent portions 22 in any second pixel row 102.

The first transparent portions 21 of any first pixel row 101 and at least a part of corresponding second transparent portions 22 of at least one of the second pixel rows 102 are arranged in same columns in a one-to-one correspondence.

In the implementation shown in FIG. 4, the ratio of the total area of all transparent portions 2 in the transparent region B to the total area of the transparent region B is 14/32.

Second Implementation

Figure 5:
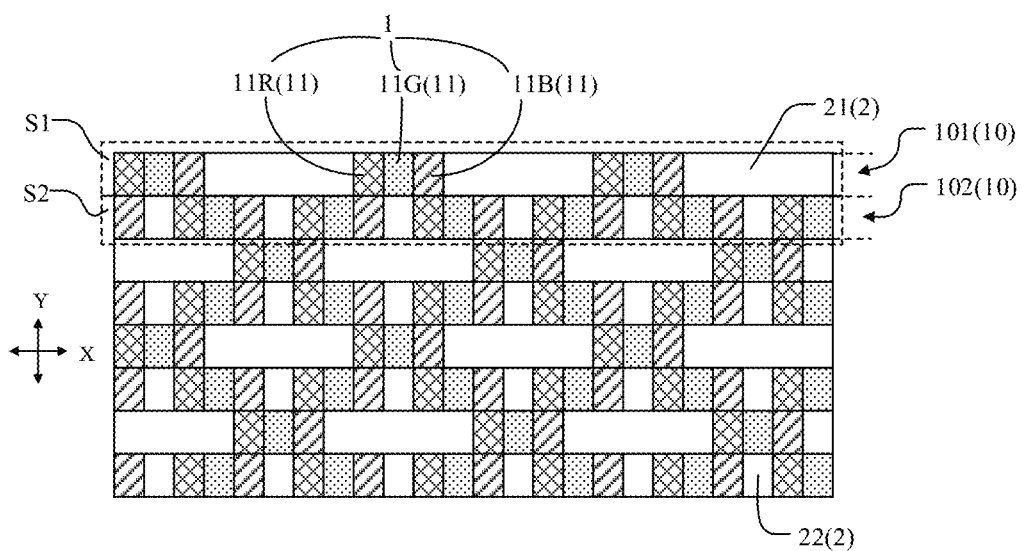
FIG. 5 is an enlarged view of the part C of the display panel as shown in FIG. 3 according to a second implementation.

As shown in FIG. 5, the number of the first pixel rows 101 in a first row unit S1 is one, and the number of the second pixel rows 102 in a second row unit S2 is one.

The value of i is 2, and any first transparent portion 21 of the n-th first pixel row 101 and any first transparent portion 21 of the (n+1)-th first pixel row 101 are arranged in different columns.

For example, the first transparent portions 21 of the first first pixel row 101 and corresponding first transparent portions 21 of the third first pixel row 101 are arranged in same columns in a one-to-one correspondence, but any one of first transparent portions 21 of the first first pixel row 101 is arranged in a different column from any first transparent portion 21 of the second first pixel row 101, and so on.

Further, the second transparent portions 22 of any two second pixel rows 102 are arranged in same columns in one-to-one correspondence, which may be the same as the distribution of the second transparent portions 22 in the first implementation.

In the transparent region B, the ratio of the total area of all transparent portions 2 to the total area of the transparent region B is 14/32.

Third Implementation

Figure 6:
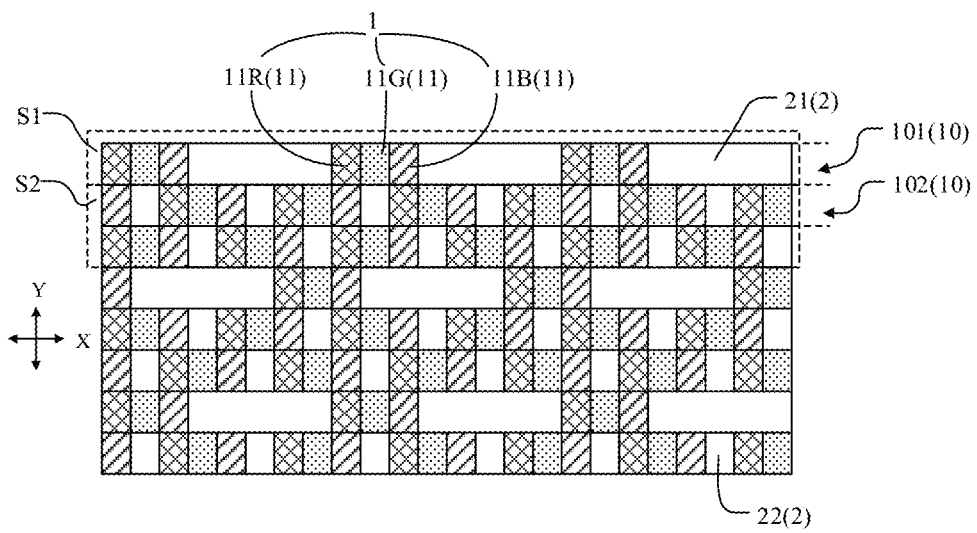
FIG. 6 is an enlarged view of the part C of the display panel as shown in FIG. 3 according to a third implementation.

As shown in FIG. 6, the number of the first pixel rows 101 in a first row unit S1 is one, the number of the second pixel rows 102 in a second row unit S2 is two, and there is no other pixel row 10 between the two second pixel rows 102.

The value of i is 2, and any first transparent portion 21 of the n-th first pixel row 101 and any first transparent portion 21 of the (n+1)-th first pixel row 101 are arranged in different columns.

Figure 16:
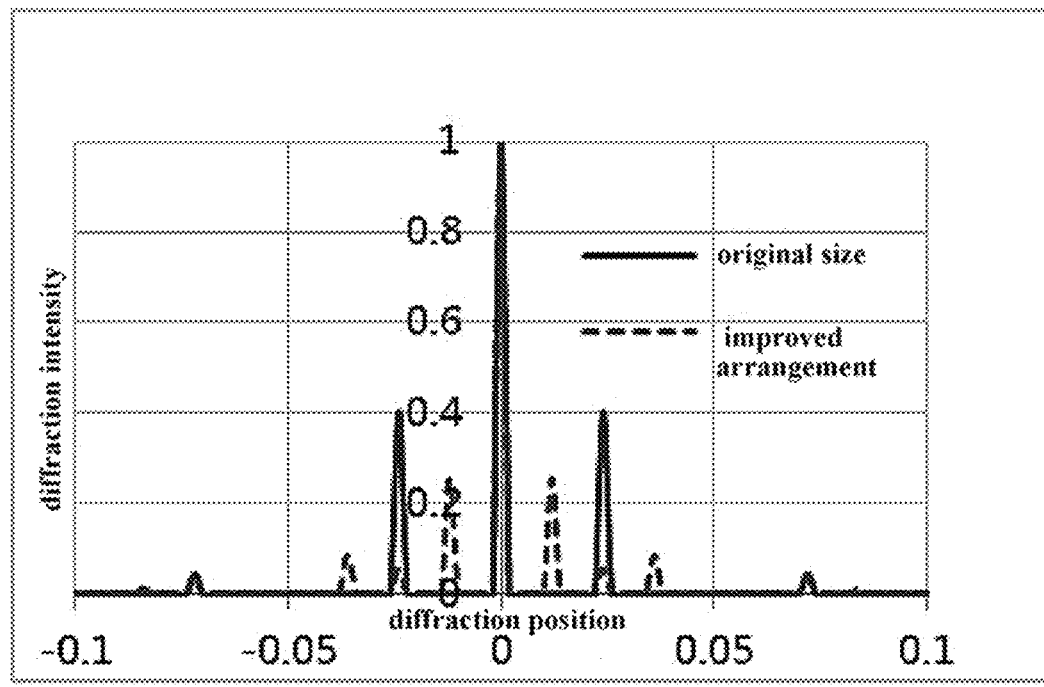
FIG. 16 is a schematic diagram showing a relationship between the diffraction intensity and the diffraction position for part I and part II in FIG. 15.

In the same second row unit S2, any two second transparent portions 22 in the two second pixel rows 102 are located in different columns. In addition, two second row units S2 which are on sides of any first row unit S1 and adjacent to the any first row unit S1 are symmetrically arranged with respect to the first row unit S1, symmetrically arranged with respect to the central axis of the first row unit S1 in the row direction. For example, as shown in FIG. 16, the first second row unit S2 and the second second row unit S2 in the column direction are symmetrically arranged with respect to the second first row unit S1.

Taking any first pixel row 101 as a reference pixel row, the first transparent portions 21 of two first pixel rows 101 adjacent to the reference pixel row are arranged in same columns in a one-to-one correspondence, and are staggered toward the same direction with respect to the reference pixel row.

In the transparent region B, the ratio of the total area of all the transparent portions 2 to the total area of the transparent region B is 12/32.

Fourth Implementation

Figure 7:
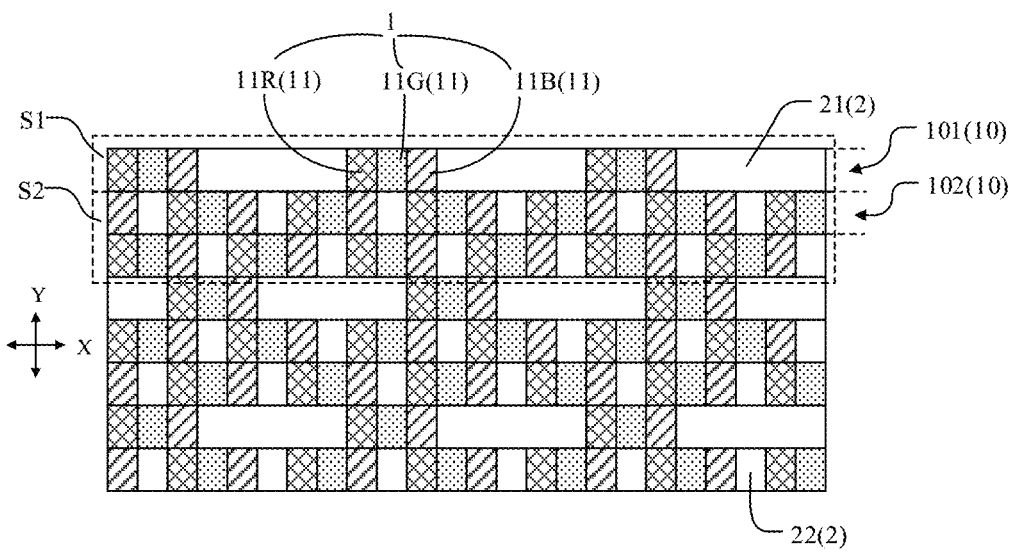
FIG. 7 is an enlarged view of the part C of the display panel as shown in FIG. 3 according to a fourth implementation.

As shown in FIG. 7, the reference pixel row in the third implementation described above is used as the reference pixel row in this implementation, and the first transparent portions 21 of two first pixel rows 101 adjacent to the reference pixel row are arranged in same columns in a one-to-one correspondence, and are staggered toward the same direction with respect to the reference pixel row. The stagger direction is opposite to the stagger direction in the above third implementation. For other contents, please refer to the above-mentioned third implementation, which will not be repeated here.

In the transparent region B, the ratio of the total area of all the transparent portions 2 to the total area of the transparent region B is 12/32.

Fifth Implementation

Figure 8:
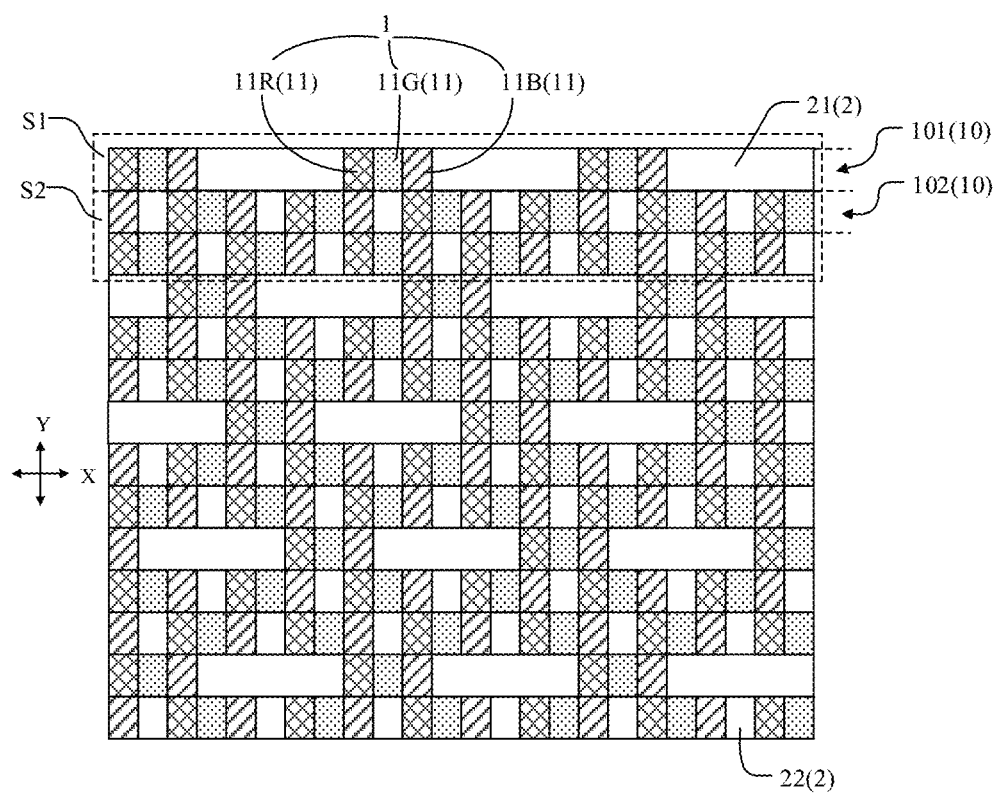
FIG. 8 is an enlarged view of the part C of the display panel as shown in FIG. 3 according to a fifth implementation.

As shown in FIG. 8, the number of the first pixel rows 101 in a first row unit S1 is one, the number of the second pixel rows 102 in a second row unit S2 is two, and there is no other pixel row 10 between the two second pixel rows 102.

The value of i is 4, and any first transparent portion 21 of the n-th first pixel row 101 and any first transparent portion 21 of the (n+1)-th first pixel row 101 are arranged in different columns.

In the same second row unit S2, any two second transparent portions 22 in two adjacent second pixel rows 102 are located in different columns. Further, two second row units S2 which are on both sides of any first row unit S1 and are adjacent to the first row unit are symmetrically arranged with respect to the first row unit S1, that is, symmetrically arranged with respect to the central axis of the first row cell S1 in the row direction.

Taking any first pixel row 101 as a reference pixel row, first transparent portions 21 in a first pixel row 101 which is adjacent to and located below the reference pixel row are staggered toward a direction with respect to the reference pixel row.

In the transparent region B, the ratio of the total area of all the transparent portions 2 to the total area of the transparent region B is 12/32.

Sixth Implementation

Figure 9:
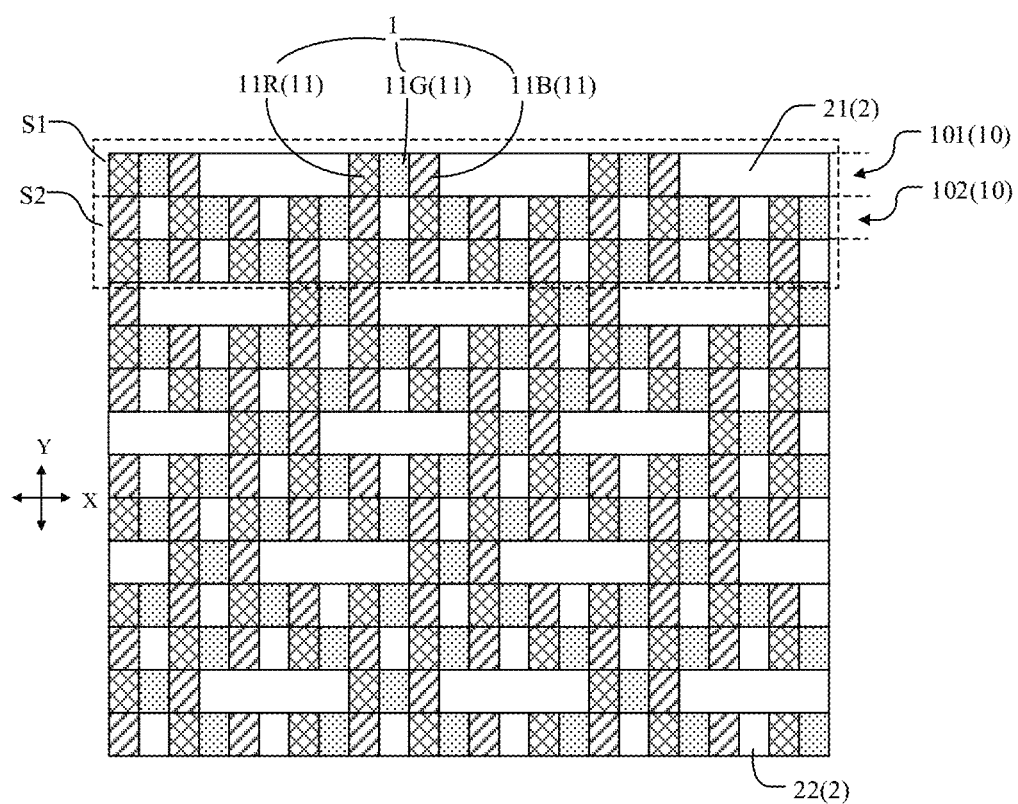
FIG. 9 is an enlarged view of the part C of the display panel as shown in FIG. 3 according to a sixth implementation.

As shown in FIG. 9, the reference pixel row in the fifth implementation described above is taken as the reference pixel row in this implementation, and the first transparent portions 21 in a first pixel row 101 which is adjacent to and located below the reference pixel row are staggered toward a direction with respect to the reference pixel row, but the stagger direction is opposite to the stagger direction in the above-mentioned fifth implementation. For other contents, please refer to the above-mentioned fifth implementation, which will not be repeated here.

In the transparent region B, the ratio of the total area of all the transparent portions 2 to the total area of the transparent region B is 12/32.

Seventh Implementation

Figure 10:
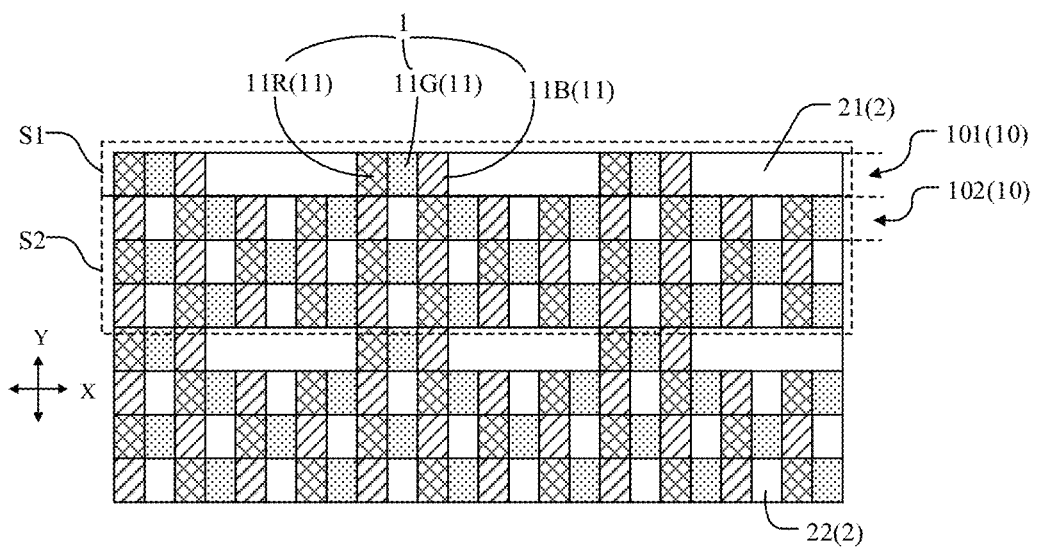
FIG. 10 is an enlarged view of the part C of the display panel as shown in FIG. 3 according to a seventh implementation.

As shown in FIG. 10, the number of the first pixel rows 101 in a first row unit S1 is one, the number of the second pixel rows 102 in a second row unit S2 is three, and here is no other pixel row 10 among the three second pixel row 102.

The value of i is 1.

In the same second row unit S2, any two second transparent portions 22 in two adjacent second pixel rows 102 are located in different columns. Further, two second row units S2 which are on both sides of any first row unit S1 and are adjacent to the any first row unit S1 are symmetrically arranged with respect to the first row unit S1, that is, symmetrically arranged with respect to the central axis of the first row cell S1 in the row direction.

In the transparent region B, the ratio of the total area of all the transparent portions 2 to the total area of the transparent region B is 11/32.

In some other embodiments of the present disclosure, the number of the first pixel rows 101 in a first row unit S1 is one, and the number of the second pixel rows 102 in a second row unit S2 can be greater than three. The specific distribution will not be described in detail.

Eighth Implementation

Figure 11:
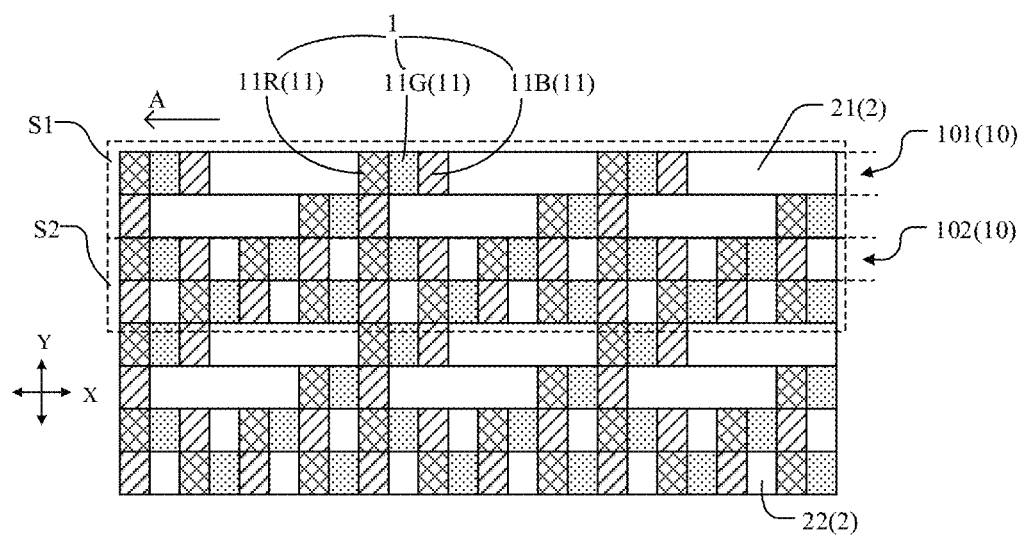
FIG. 11 is an enlarged view of the part C of the display panel as shown in FIG. 3 according to an eighth implementation.

As shown in FIG. 11, the number of first pixel rows 101 in a first row unit S1 is more than one, and the number of second pixel rows 102 in a second row unit S2 is more than one.

In a same first row unit S1, any two first transparent portions 21 in two adjacent first pixel rows 101 are located in different columns.

In a same second row unit S2, any two second transparent portions 22 in two adjacent second pixel rows 102 are located in different columns.

First transparent portions 21 in a first pixel row 101 of any first row unit S1 and corresponding first transparent portions 21 in a first pixel row 101 of another first row unit S1 are arranged in same columns in a one-to-one correspondence.

For example, the number of the first pixel rows 101 in a first row unit S1 is two, and the number of the second pixel rows 102 in a second row unit S2 is two.

In the same first row unit S1, any two first transparent portions 21 in the two first pixel rows 101 are located in different columns. In addition, the first transparent portions 21 in the lower first pixel row 101 are staggered toward a direction (such as the direction indicated by the arrow A) with respect to the upper first pixel row 101.

In the same second row unit S2, any two second transparent portions 22 in the two second pixel rows 102 are located in different columns.

First transparent portions 21 of an upper first pixel row 101 in any first row cell S1 and corresponding first transparent portions 21 of an upper first pixel row 101 in another first row cell S1 are arranged in same columns in a one-to-one correspondence. First transparent portions 21 of a lower first pixel row 101 in any first row cell S1 and corresponding first transparent portions 21 of a lower first pixel row 101 in another first row cell S1 are arranged in same columns in a one-to-one correspondence.

In the transparent region B, the ratio of the total area of all transparent portions 2 to the total area of the transparent region B is 14/32.

Ninth Implementation

Figure 12:
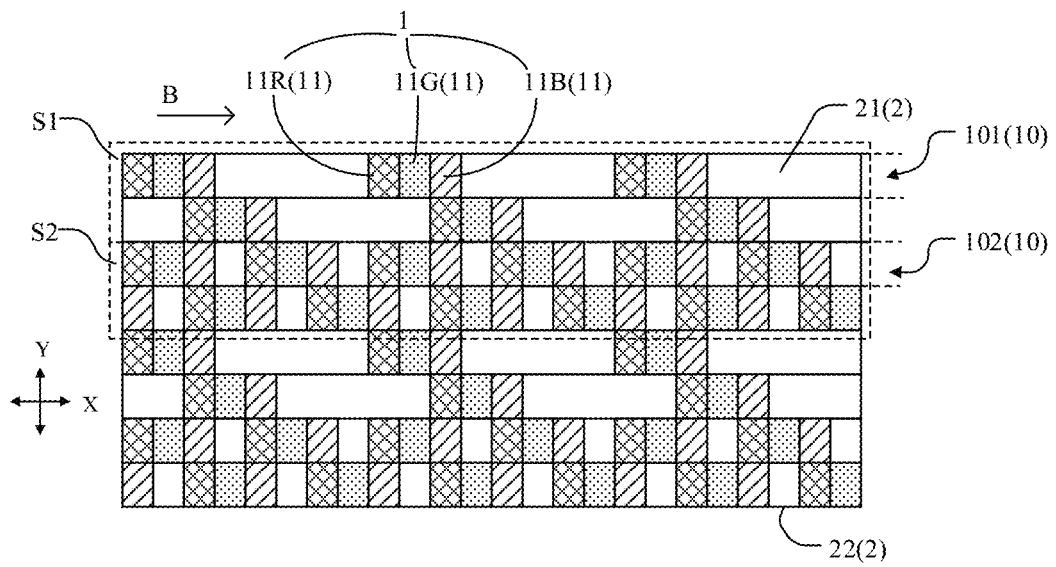
FIG. 12 is an enlarged view of the part C of the display panel as shown in FIG. 3 according to a ninth implementation.

As shown in FIG. 12, the number of first pixel rows 101 in a first row unit S1 is two, and the number of second pixel rows 102 in a second row unit S2 is two. In a same first row unit S1, the first transparent portions 21 of the lower first pixel row 101 are staggered toward a direction (for example, the direction indicated by the arrow B) with respect to the upper first pixel row 101, and the stagger direction is opposite to the stagger direction in the above-mentioned eighth implementation. For other contents, please refer to the above-mentioned eighth implementation, which will not be repeated here.

In the transparent region B, the ratio of the total area of all transparent portions 2 to the total area of the transparent region B is 14/32.

Second Rule

Figure 13:
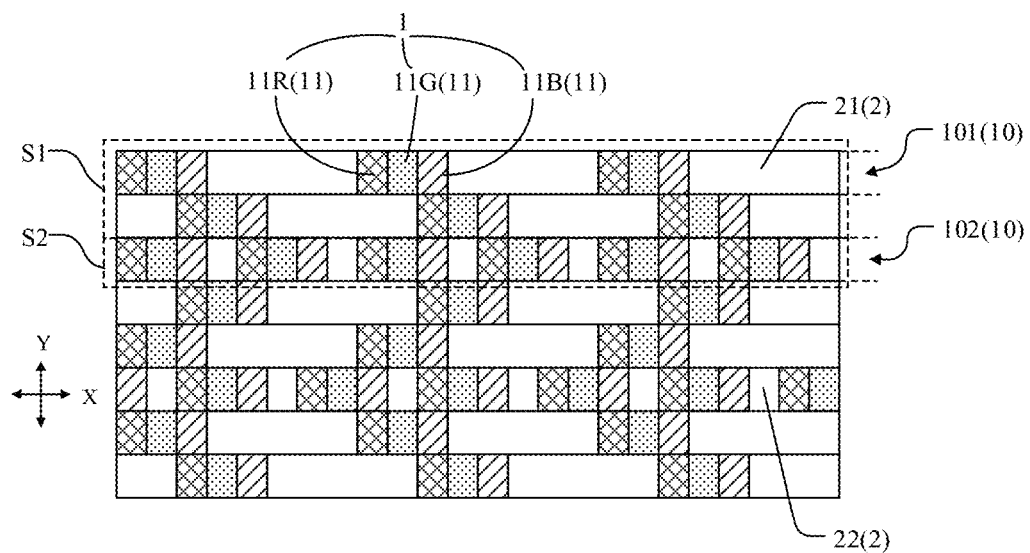
FIG. 13 is an enlarged view of the part C of the display panel as shown in FIG. 3 according to a tenth implementation.

As shown in FIG. 13, the number of the first pixel rows 101 in a first row unit S1 is more than one, and the number of the second pixel rows 102 in a second row unit S2 is one.

In a same first row unit S1, any two first transparent portions 21 in two adjacent first pixel rows 101 are located in different columns.

Two first row units S1 which are on both sides of any second row unit S2 and adjacent to the any second row unit S2 are symmetrically arranged with respect to the second row unit S2.

Any two second transparent portions 22 in two second row units S2 which are on both sides of any first row unit S1 and adjacent to the any first row unit S1 are located in different columns.

Under the second rule, at least the following implementations are included

Tenth Implementation

As shown in FIG. 13, the number of the first pixel row 101 in a first row unit S1 is two, and the number of the second pixel rows 102 in a second row unit S2 is one.

In a same first row unit S1, any two first transparent portions 21 in the two first pixel rows 101 are located in different columns.

Two first row units S1 which are on both sides of any second row unit S2 and are adjacent to the any second row unit S2 are symmetrically arranged with respect to the second row unit S2.

Any two second transparent portions 22 in two second row units S2 which are on the both sides of any first row unit S1 and are adjacent to the any first for unit S1 are located in different columns.

In the transparent region B, the ratio of the total area of all transparent portions 2 to the total area of the transparent region B is 16/32.

The following describes verification result of the effects of embodiments of the present disclosure.

Figure 15:
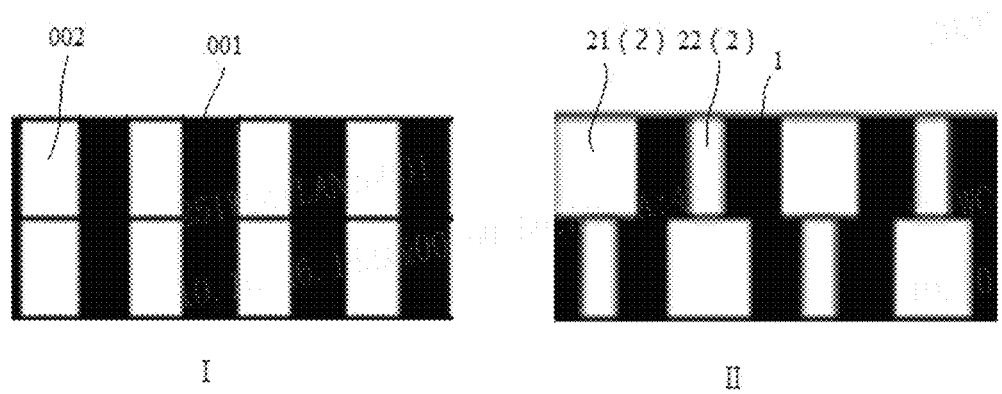
FIG. 15 is a comparison diagram of two transparent portion arrangements for verifying the technical effects of the present disclosure.

As shown in FIG. 15, part I in FIG. 15 shows an arrangement of transparent portions in related arts in which the transparent portions 002 are of the same size. The transparent portions 002 and the sub-pixels 001 are alternately distributed, and a black area can indicate multiple sub-pixels 001. Part II shows an arrangement of transparent portions which include transparent portions of different sizes. Part I and part II are only used to verify the diffraction effect of using transparent portions of the same size and using two transparent portions of different sizes, and Part II is not necessarily to be any one of the above described implementations.

As shown in FIG. 16, FIG. 16 shows the relationship between the diffraction intensity and diffraction position for Part I and Part II in FIG. 15. The line for the original size is used to characterize the relationship between the diffraction intensity and the diffraction position for Part I. The line show for the improved arrangement is used to characterize the relationship between the diffraction intensity and the diffraction position for Part II. It can be seen that compared to Part I, the diffraction intensity for Part II is only enhanced at the 0-order position, while the diffraction intensity of the first and second orders is significantly reduced. Therefore, it can be determined that transparent portions with different sizes can significantly reduce the adverse effects of diffraction on photography.

Figure 17:
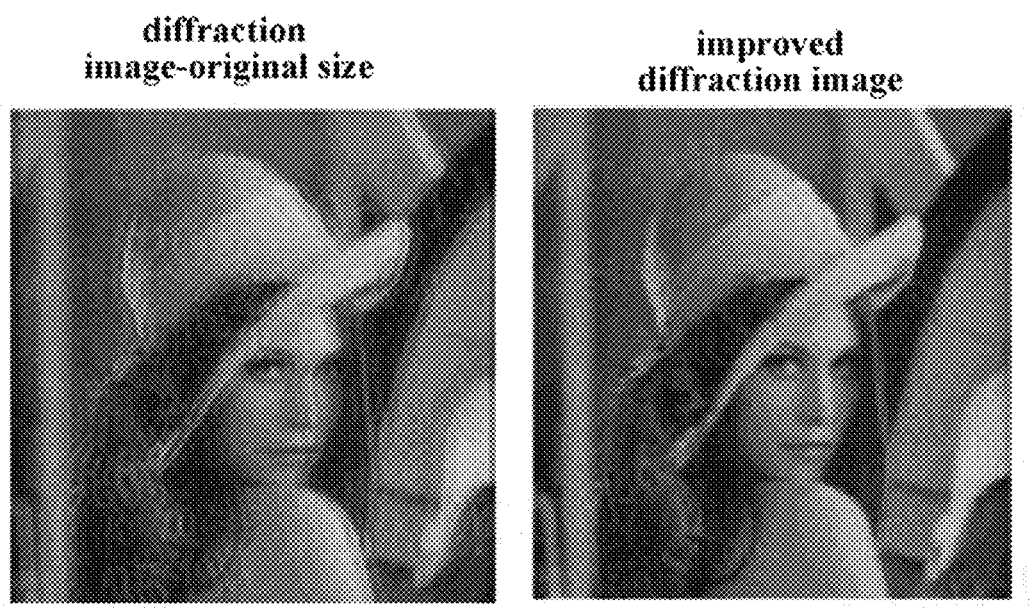
FIG. 17 is a schematic diagram showing diffraction images after photographing part I and part II in FIG. 15.

As shown in FIG. 17, FIG. 17 shows the images taken by the display panels with the original sizes and the improved structure, namely the diffraction image for the original size and the improved diffraction image. Because the superposition of the diffractions of the different transparent portions 2 is reduced, the overall diffraction effect is weakened, rather than being strengthened, and thus as can be clearly seen, the improved diffraction image is clearer than the diffraction image for the original size.

Figure 14:
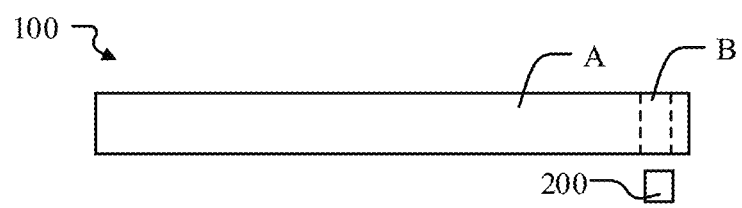
FIG. 14 is a schematic diagram showing a terminal device according to an embodiment of the present disclosure.

As shown in FIG. 14, an embodiment of the present disclosure provides a terminal device. The terminal device may include a camera 200 and the display panel 100 according to any one of embodiments of the present disclosure. The specific structures of the display panel 100 will not be described in detail here.

The camera device 200 can be arranged on the backlight side of the display panel 100, that is, the side opposite to the light emission direction. For example, the OLED light emitting unit of the display panel 100 has a top emission structure, that is, the OLED light emitting unit emits light in a direction away from the driving backplane, the camera device 200 can be arranged on a side of the driving backplane away from the light-emitting function layer, and the camera device 200 can be directly opposite to the transparent region B for capturing images through the transparent region B. If the OLED light-emitting unit of the display panel 100 has a bottom emission structure, the camera device 200 can be arranged on a side of the light-emitting function layer away from the driving backplane. The camera device 200 may include a lens, a photoelectric sensor, etc., and the specific structure of the imaging device 200 is not particularly limited here, as long as it can capture images.

The terminal device according to embodiments of the present disclosure may be an electronic device with display and shooting functions such as a mobile phone, a tablet computer, a TV, or the like, which will not be listed here.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are exemplary, and the scope and spirit of the present disclosure are defined by the appended claims.

What is claimed is:

1. A display panel, comprising:
   a display region, wherein at least a part of the display region is a transparent region, the transparent region has a plurality of pixel rows distributed along a column direction, and each of the plurality of pixel rows comprises a plurality of pixels and a plurality of transparent portions arranged alternately in a row direction, and each of the plurality of pixels comprises sub-pixels of different colors which are arranged adjacently along the row direction;
   wherein the plurality of pixel rows comprise a plurality of first pixel rows and a plurality of second pixel rows, transparent portions each arranged between two adjacent pixels in each of the first pixel rows are first transparent portions, and transparent portions each arranged between two adjacent pixels in each of the second pixel rows are second transparent portions;
   wherein a width of each of the first transparent portions in the row direction is greater than a width of each of the second transparent portions in the row direction.

2. The display panel according to claim 1, wherein a plurality of pixels and a plurality of transparent portions arranged in a same row are arranged alternately.

3. The display panel according to claim 2, wherein:
   the first pixel rows are divided into a plurality of first row units, the second pixel rows are divided into a plurality of second row units, and the first row units and the second row units are alternately distributed along the column direction;
   in the column direction, first transparent portions in an n-th first pixel row and corresponding first transparent portions in a (n+i)-th first pixel row are arranged in same columns in a one-to-one correspondence;
   where n+i≤N, N is a number of the first pixel rows, and n and i are both positive integers; and
   first transparent portions in any one of the first pixel rows and at least a part of corresponding second transparent portions in at least one of the second pixel rows are arranged in same columns in a one-to-one correspondence.

4. The display panel according to claim 3, wherein:
   there is one first pixel row in each of the first row units, and there is one second pixel row in each of the second row units,
   a value of i is 1; and
   second transparent portions in any two of the second pixel rows are arranged in same columns in a one-to-one correspondence.

5. The display panel according to claim 3, wherein:
   there is one first pixel row in each of the first row units, and there is one second pixel row in each of the second row units;
   a value of i is 2, and any one of the first transparent portions in the n-th first pixel row and any one of the first transparent portions in the (n+1)-th first pixel row are arranged in different columns; and
   second transparent portions in any two of the second pixel rows are arranged in same columns in a one-to-one correspondence.

6. The display panel according to claim 3, wherein:
   there is one first pixel row in each of the first row units, and there are a plurality of second pixel rows in each of the second row units;
   in a same second row unit, any two second transparent portions in two adjacent ones of the second pixel rows are arranged in different columns; and
   a value of i is greater than or equal to 2, and any one of the first transparent portions in the n-th first pixel row and any one of the first transparent portions in the (n+1)-th first pixel row are arranged in different columns.

7. The display panel according to claim 6, wherein there are two second pixel rows in each of the second row units, and the value of i is 2 or 4.

8. The display panel according to claim 3, wherein:
   there is one first pixel row in each of the first row units, and there are three second pixel rows in each of the second row units;
   a value of i is 1; and
   in a same second row unit, any two second transparent portions in two adjacent ones of the second pixel rows are arranged in different columns;
   two second row units which are arranged at both sides of any one of the first row units and are adjacent to the any one of the first row units are arranged symmetrically with respect to the any one of the first row units.

9. The display panel according to claim 3, wherein:
   there are a plurality of first pixel rows in each of the first row units, and there are a plurality of second pixel rows in each of the second row units;
   in a same first row unit, any two first transparent portions in two adjacent ones of the first pixel rows are arranged in different columns;
   in a same second row unit, any two second transparent portions in two adjacent one of the second pixel rows are arranged in different columns; and
   first transparent portions in one of the first pixel rows of any one first row unit and corresponding first transparent portions in one of the first pixel rows of another first row unit are arranged in same columns in a one-to-one correspondence.

10. The display panel according to claim 9, wherein:
    there are two first pixel rows in each of the first row units, and there are two second pixel rows in each of the second row units; and
    a value of i is 2.

11. The display panel according to claim 1, wherein:
    the first pixel rows are divided into a plurality of first row units, the second pixel rows are divided into a plurality of second row units, and the first row units and the second row units are alternately distributed along the column direction;
    there are a plurality of first pixel rows in each of the first row units, and there is one second pixel row in each of the second row units;
    in a same first row unit, any two first transparent portions in two adjacent ones of the first pixel rows are arranged in different columns;
    two first row units which are arranged at both sides of any one of the second row units and adjacent to the any one of the second row units are arranged symmetrically with respect to the any one of the second row units; and
    any two second transparent portions in two second row units which are arranged at both sides of any one of the first row units and adjacent to the any one of the first row units are arranged in different columns.

12. The display panel according to claim 1, wherein in the row direction, a sum of a width of one of the pixels and widths of two of the second transparent portions is equal to a width of one of the first transparent portions.

13. The display panel according to claim 12, wherein:
there are three sub-pixels arranged adjacently in the row direction in each of the pixels, and colors of the three sub-pixels are different from each other, and
in the row direction, a width of any one of the first transparent portions is five times a width of one of the sub-pixels, and a width of any one of the second transparent portions is the same as a width of one of the sub-pixels.

14. The display panel according to claim 1, wherein in the transparent region, a ratio of a total area of all the transparent portions to a total area of the transparent region is 11/32 to 16/32.

15. A terminal device, comprising:
a display panel, wherein the display panel comprises a display region, at least a part of the display region is a transparent region, the transparent region has a plurality of pixel rows distributed along a column direction, and each of the plurality of pixel rows comprises a plurality of pixels and a plurality of transparent portions arranged alternately in a row direction, and each of the plurality of pixels comprises sub-pixels of different colors which are arranged adjacently along the row direction;
wherein the plurality of pixel rows comprise a plurality of first pixel rows and a plurality of second pixel rows, transparent portions each arranged between two adjacent pixels in each of the first pixel rows are first transparent portions, and transparent portions each arranged between two adjacent pixels in each of the second pixel rows are second transparent portions;
wherein a width of each of the first transparent portions in the row direction is greater than a width of each of the second transparent portions in the row direction; and
a camera device arranged on a backlight side of the display panel and opposite to the transparent region, the camera device being configured to take images through the transparent region.

16. The terminal device according to claim 15, wherein a plurality of pixels and a plurality of transparent portions arranged in a same row are arranged alternately.

17. The terminal device according to claim 16, wherein:
the first pixel rows are divided into a plurality of first row units, the second pixel rows are divided into a plurality of second row units, and the first row units and the second row units are alternately distributed along the column direction;
in the column direction, first transparent portions in an n-th first pixel row and corresponding first transparent portions in a (n+i)-th first pixel row are arranged in same columns in a one-to-one correspondence;
where n+i≤N, N is a number of the first pixel rows, and n and i are both positive integers; and
first transparent portions in any one of the first pixel rows and at least a part of corresponding second transparent portions in at least one of the second pixel rows are arranged in same columns in a one-to-one correspondence.

18. The terminal device according to claim 17, wherein:
there is one first pixel row in each of the first row units, and there is one second pixel row in each of the second row units;
a value of i is 1; and
second transparent portions in any two of the second pixel rows are arranged in same columns in a one-to-one correspondence.

19. The terminal device according to claim 17, wherein:
there is one first pixel row in each of the first row units, and there is one second pixel row in each of the second row units;
a value of i is 2, and any one of the first transparent portions in the n-th first pixel row and any one of the first transparent portions in the (n+1)-th first pixel row are arranged in different columns; and
second transparent portions in any two of the second pixel rows are arranged in same columns in a one-to-one correspondence.

20. The terminal according to claim 17, wherein:
there is one first pixel row in each of the first row units, and there are a plurality of second pixel rows in each of the second row units;
in a same second row unit, any two second transparent portions in two adjacent ones of the second pixel rows are arranged in different columns; and
a value of i is greater than or equal to 2, and any one of the first transparent portions in the n-th first pixel row and any one of the first transparent portions in the (n+1)-th first pixel row are arranged in different columns.

* * * * *